(12) United States Patent
Hyvönen et al.

(10) Patent No.: US 6,670,864 B2
(45) Date of Patent: Dec. 30, 2003

(54) MATCHING CIRCUIT INCLUDING A MEMS CAPACITOR

(75) Inventors: Lassi Hyvönen, Helsinki (FI); Esko Järvinen, Espoo (FI)

(73) Assignee: Nokia Mobile Phones Ltd., Espoo (FI)

( * ) Notice: Subject to any disclaimer, the term of this patent is extended or adjusted under 35 U.S.C. 154(b) by 122 days.

(21) Appl. No.: 09/892,674

(22) Filed: Jun. 27, 2001

(65) Prior Publication Data

US 2001/0054937 A1 Dec. 27, 2001

(30) Foreign Application Priority Data

Jun. 27, 2000 (FI) .............................. 20001525

(51) Int. Cl.[7] .................................. H03H 7/38
(52) U.S. Cl. ......................... 333/32; 333/262
(58) Field of Search .................... 333/262, 32

(56) References Cited

U.S. PATENT DOCUMENTS

| | | | |
|---|---|---|---|
| 5,276,912 A | 1/1994 | Siwiak et al. .................. 455/73 |
| 5,696,662 A | 12/1997 | Bauhahn ................... 361/298.1 |
| 5,808,527 A | * 9/1998 | De Los Santos ............ 333/205 |
| 5,834,975 A | 11/1998 | Bartlett et al. ............... 330/278 |
| 5,880,921 A | * 3/1999 | Tham et al. ................. 361/233 |
| 6,127,908 A | * 10/2000 | Bozler et al. ............... 333/246 |
| 6,150,901 A | 11/2000 | Auken ........................ 333/174 |
| 6,232,841 B1 | * 5/2001 | Bartlett et al. .............. 330/305 |

OTHER PUBLICATIONS

"International Journal of RF and Microwave Computer–Aided Engineering", John Wiley & Sons, CAE 9:362–374, 1999.

* cited by examiner

Primary Examiner—Benny Lee
Assistant Examiner—Stephen E. Jones
(74) Attorney, Agent, or Firm—Perman & Green, LLP

(57) ABSTRACT

The invention relates to a matching circuit for adapting an amplifier to load impedance at various output power levels of the amplifier, and a method for adapting the amplifier to load impedance at various output power levels of the amplifier. The matching circuit comprises an LC circuit, i.e. an electric circuit switching consisting of at least one coil and at least one capacitor for tuning harmonic signals resulting from amplifier non-linearities. At least one capacitor of the LC circuit (600, 602, 604, 606) is an adjustable microelectromechanical (MEMS) capacitor (602, 606). The LC circuit comprises an interface for receiving control signals (220) adjusting capacitance of the microelectromechanical (MEMS) capacitor. The control signals (220) adjust the capacitance of the microelectromechanical (MEMS) capacitor (602, 606) such that the LC circuit (600, 602, 604, 606) resonates at the frequency of the harmonic signal to be tuned.

22 Claims, 3 Drawing Sheets

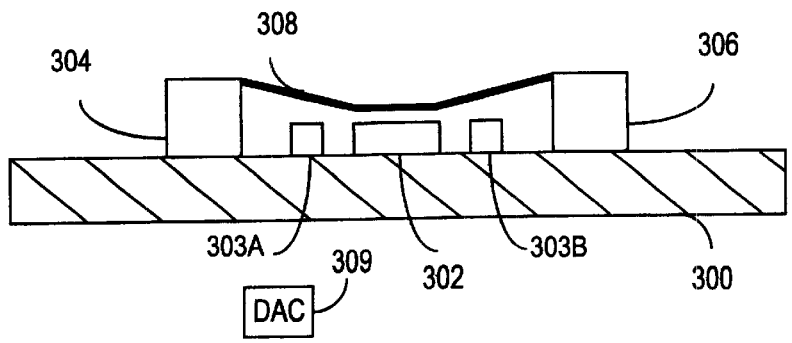
PRIOR ART
Fig. 3C
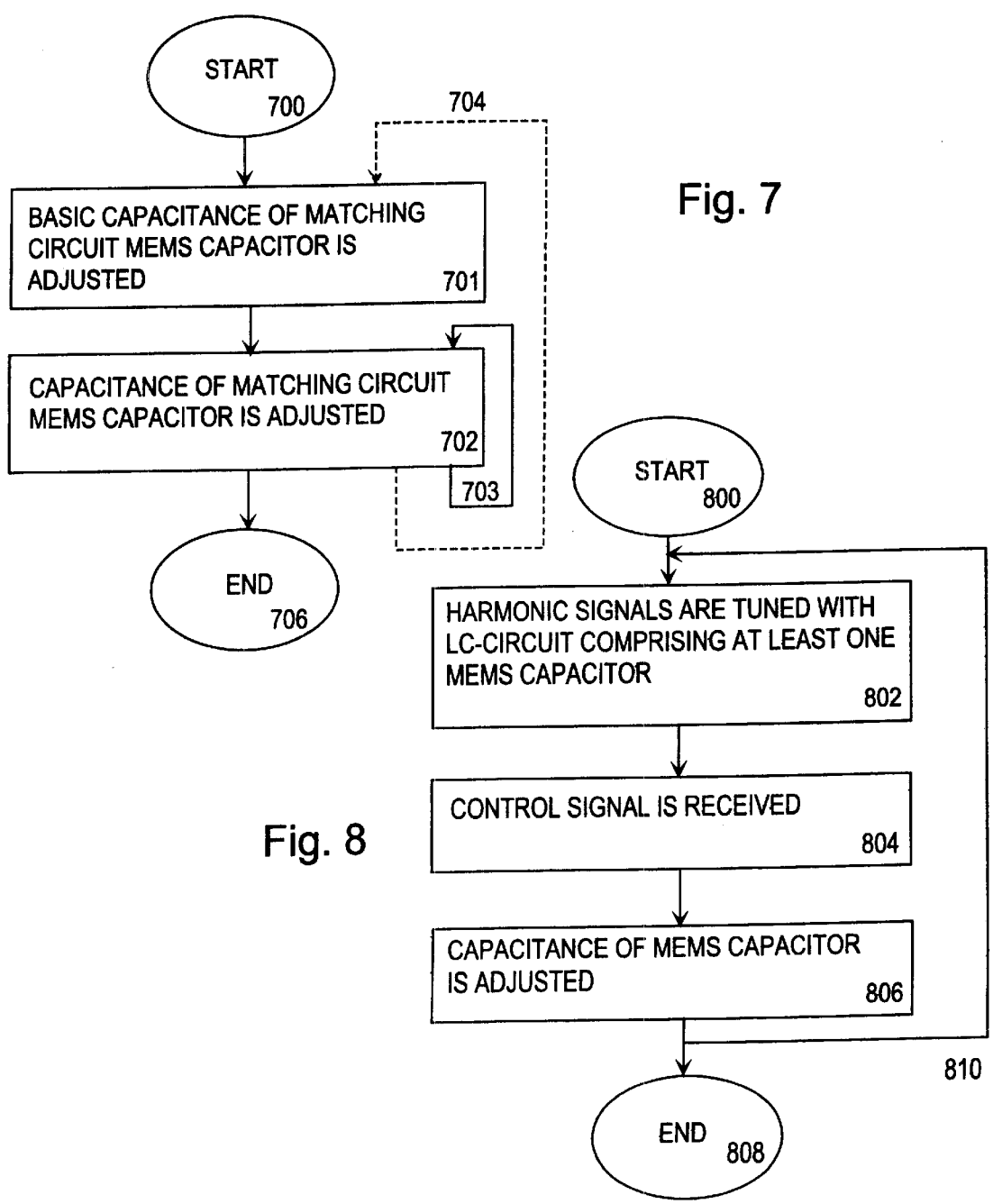
Fig. 7
Fig. 8

MATCHING CIRCUIT INCLUDING A MEMS CAPACITOR

FIELD OF THE INVENTION

The invention relates to a matching circuit, by which a radio-frequency amplifier can electrically be adjusted to a load, and a method for adapting the amplifier to load impedance at various amplifier output power levels by means of the matching circuit.

BACKGROUND OF THE INVENTION

A radio channel changes constantly as a function of time. For instance, as a subscriber terminal moves, changes in multipath propagation environment cause changes in the radio channel. It is important to adapt the subscriber terminal's transmission power level such that the signal level is sufficient for a base station to receive and detect the signal, and that it causes as little interference as possible to other users of the system. Transmitters use power amplifiers for adjusting the transmission power to a desired level. Receivers use pre-amplifiers for amplifying the power of the received signal that has become weak on a radio channel. Output powers of the amplifiers in the subscriber terminals and the base station are adjusted as the radio channel changes. In addition, the amplifiers have to be matched with an antenna and operating environment of the antenna by impedance matching. Conventionally, the matching circuit of a transmitter amplifier consists of passive circuit elements with constant values. A matching circuit of this kind can be adapted in optimal state only to one predetermined output power level, for which is generally selected the maximum power level. In addition, if the transmitter is supposed to operate on any desired channel of a broad band, the optimal adaption setting changes according to the channel.

Harmonic signals, of which the second harmonic signal, in particular, is harmful in radio-frequency applications, and which result from amplifier non-linearities, reduce the efficiency of the amplifier. To improve the efficiency, a typical solution is a frequency selective circuit, which is tuned to a desired harmonic signal frequency. It can be implemented by a simple LC circuit (inductance-capacitance), which resonates at the tuned frequency and thus short-circuits the signal portion that comprises the harmonic frequency. The prior art implementation has a problem that in order to operate efficiently the circuit must have a high Q value, i.e. quality factor, and as the Q value is high the circuit operates optimally only on a narrow frequency band.

U.S. Pat. No. 5,276,912 discloses a radio-frequency power amplifier having variable output power. The publication sets forth a plurality of different alternatives to match load impedance with the output power. The alternatives of the solution employ e.g. switches consisting of PIN diodes or transistors, or capacitors controlled by bias voltage, or varactors. However, the disclosed solutions have disadvantages: for instance, components used cause interference, such as distortion, to the output signal. In addition, when the device switches on, sudden, major changes in power generate major voltage variations, and consequently sensitive components must be protected by various solutions. Neither does the publication provide a solution for the problem of reduced amplifier efficiency resulting from the harmonic signals.

Microelectromechanical MEMS (microelectromechanical system) components have currently been developed. In general, the microelectromechanical (MEMS) components are manufactured onto a semiconductor substrate, such as silicon (Si) or gallium-arsenide (GaAs), because in this manner it is possible to integrate them with conventional semi-conductor components as manufacturing technology advances. It is also possible to manufacture microelectromechanical (MEMS) components onto a dielectric material, such as aluminium oxide. The MEMS components have a structure that is, at least in part, off from the base material, typically a membrane-like bridge, which opens and closes the circuit of the component. The bridge is controlled to on/off states by control voltage. The control voltage is applied to the semi-conductor substrate to a conductive layer obtained by precipitation, which layer forms one or more electrodes. The electrode is located below the bridge, and therefore the position of the bridge can be controlled: when the bridge touches the electrode, the circuit is closed, and when the bridge does not touch the electrode, the circuit is open. If there is an isolating layer on top of the electrode, the bridge has no galvanic contact to the electrode. Thus at least, direct current does not provide a closed circuit. Capacitance between the bridge and the electrode is then high. Components manufactured by MEMS technology have mainly been used in write heads of ink-jet printers and in sensors, such as triggering mechanisms of air bags in vehicles. Radio frequency applications mainly utilize passive components manufactured by MEMS technology because of space saving. dr

BRIEF DESCRIPTION OF THE INVENTION

The object of the invention is to provide a method and equipment implementing the method such that a radio-frequency amplifier can be adjusted to an optimal state at a plurality of different power levels and operating frequencies. This is achieved with a matching circuit for adapting the amplifier to load impedance at various output power levels of the amplifier, the matching circuit comprising an interface for receiving control signals, which determine capacitance of one or more capacitors. In the matching circuit of the invention at least one matching circuit capacitor is a microelectromechanical (MEMS) capacitor, whose capacitance the control signals adjust to make the amplifier operate optimally at a selected frequency at a power level used, and consequently making the amplifier operate optimally in the whole desired power range.

The invention also relates to a matching circuit for adapting the amplifier to load impedance at various output power levels of the amplifier, the matching circuit comprising one or more LC circuits, i.e. an electric circuit switching consisting of at least one coil and at least one capacitor for tuning harmonic signals resulting from amplifier non-linearities. In the matching circuit of the invention, at least one LC circuit capacitor is an adjustable microelectromechanical (MEMS) capacitor, the LC circuit comprises an interface for receiving the control signals adjusting the capacitance of the microelectromechanical (MEMS) capacitor, the control signal adjusts the capacitance of the microelectromechanical (MEMS) capacitor such that the LC circuit resonates at the frequency of each harmonic signal to be tuned.

The invention also relates to a method for adapting an amplifier to load impedance with a matching circuit at various output power levels of the amplifier, the matching circuit comprising an interface for receiving control signals which determine capacitance of one or more capacitors. The method of the invention adjusts the capacitance of at least one microelectromechanical (MEMS) capacitor of the matching circuit such that the amplifier operates optimally in a broad output power range.

The invention also relates to a method for adjusting the amplifier to load impedance with a matching circuit at various output power levels of the amplifier, the matching circuit comprising one or more LC circuits, i.e. an electric circuit switching consisting of at least one coil and at least one capacitor for tuning harmonic signals resulting from amplifier non-linearities. In the method of the invention, harmonic signals are tuned with an LC circuit, the LC circuit comprising at least one adjustable microelectromechanical (MEMS) capacitor, control signals adjusting the capacitance of the microelectromechanical (MEMS) capacitor through an interface in the LC circuit are received, the capacitance of the microelectromechanical (MEMS) capacitor is adjusted by at least one control signal such that the LC circuit resonates at the frequency of the harmonic signal to be tuned.

The preferred embodiments of the invention are disclosed in the dependent claims.

The invention is based on the idea that adjustable, microelectromechanical (MEMS) capacitors are introduced to radio-frequency amplifiers and/or LC circuits connected thereto intended for tuning harmonic signals. In this way, it is possible to optimize the efficiency in energy transmission from the amplifier to the load impedance as the output power and operating frequency of the amplifier varies.

Several advantages are achieved by the method and the system of the invention. By the method and system according to a first embodiment of the invention for adjusting a matching circuit of a radio-frequency amplifier it is possible to adapt the optimum load impedance of the amplifier to the load impedance according to changes in the output power and operating frequency. Thanks to adjustability, the method and system of a second embodiment of the invention for tuning harmonic signals allow to achieve a more accurate and quicker adaption to the harmonic frequency concerned.

The MEMS capacitors are extremely linear as to their electric properties, because they have no P/N interface (interface of positive and negative charge carriers), and therefore they do not generate non-linearities that are typical to semi-conductor components, such as PIN diodes and FET (Field-Effect Transistor) components. Non-linearity of the component is harmful, because it causes signal distortion. In addition, the MEMS capacitors tolerate well large voltage variations and they have good AC voltage toleration, so there is less need for separate components or circuits protecting against voltage peaks. Furthermore, losses of the MEMS capacitors are very small and their service life as compared with MEMS switches is considerably long.

BRIEF DESCRIPTION OF THE DRAWINGS

In the following the invention will be described in greater detail in connection with preferred embodiments, with reference to the attached drawings, wherein

FIGS. 3a–c illustrate examples of structure and operation of prior art microelectromechanical (MEMS) capacitors;

FIG. 7 shows method steps of implementing a first preferred embodiment, adapting a radio-frequency amplifier to load impedance, at a desired frequency; and FIG. 8 shows method steps of implementing a second embodiment, adjustable tuning method of harmonic signals.

DETAILED DESCRIPTION OF THE INVENTION

Figure 1:
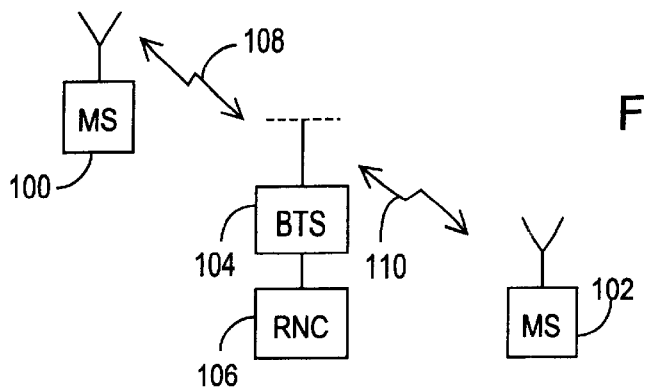
FIG. 1 illustrates an example of a telecommunication system.

FIG. 1 illustrates, in a simplified manner, one digital data transmission system, to which the solution of the invention can be applied. It concerns a part of a cellular radio system which comprises a base station 104, communicating 108 and 110 with subscriber terminals 100 and 102 that can be fixed terminals, terminals in a vehicle or portable terminals. Transceivers of the base station 104 have a connection to an antenna unit which implements the radio connection to the subscriber terminal 100, 102. The base station 104 further communicates with a base station controller 106 which switches the connections of the terminals 100, 102 elsewhere in the network or to a public switched telephone network. The base station controller 106 controls a plurality of base stations 104 communicating therewith in a centralized manner. A control unit located in the base station controller 106 performs call control, mobility management, collection of statistics and signalling.

Figure 2:
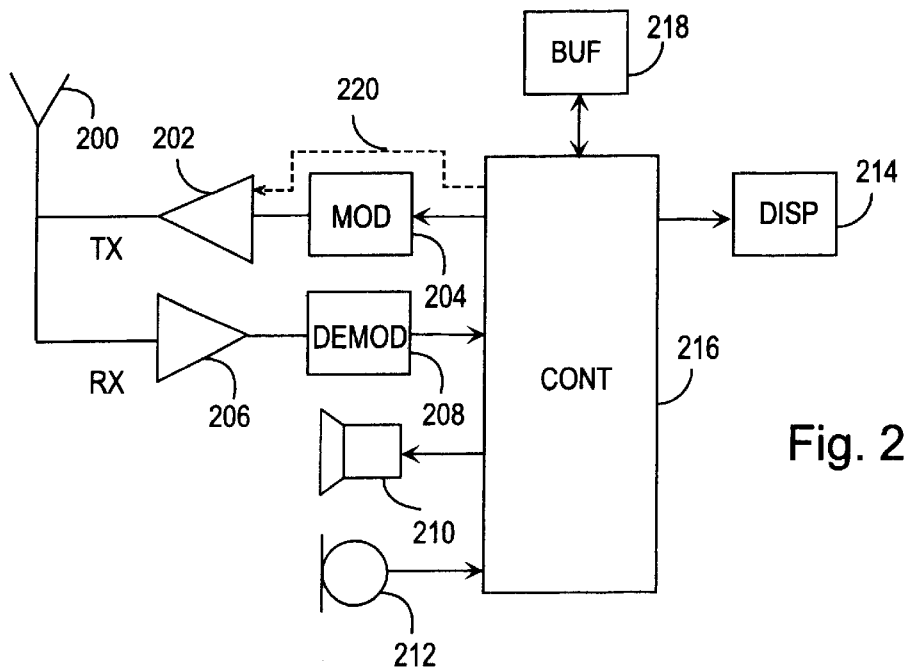
FIG. 2 shows a structure of one subscriber terminal in a simplified manner.

FIG. 2 illustrates one radio system terminal which generally employs radio-frequency amplifiers. Transmitter amplifiers are generally called power amplifiers and receiver amplifiers are called preamplifiers. The transmitter of the subscriber terminal and the transmitter of the radio system network part carry out partly the same tasks. Correspondingly, the receiver of the subscriber terminal and the receiver of the radio system network part carry out partly the same tasks. The radio system network part also comprises power amplifiers and preamplifiers. The subscriber terminal can be e.g. a portable telephone or a microcomputer without restricting thereto, however. The described terminal comprises an antenna 200 by which signals are transmitted and received. The system may also comprise separate antennas for transmitters and receivers, and consequently a duplex filter is not needed for separating the transmitter and receiver signals. The terminal may also comprise a plurality of antennas or a multi-antenna system. The modulated signal is amplified on the transmitter side of the terminal by a power amplifier 202. Power amplifiers 202 are used in various electronic devices, such as radio device applications. The function of the power amplifier 202 is to amplify the power of the input signal to be suitable for the load. In transmitters, the power amplifiers 202 are generally used to amplify an excessively weak signal to be transmitted to a sufficient transmission power level. In receivers, the preamplifiers 206 are used to amplify the received signal, faded on the radio path, to a sufficient power level for detection. In general, the power amplifier 202 and the preamplifier 206 have to be adapted to their operating environment by various circuit solutions, whose design, i.e. selection of component types and amounts and coupling manners, depend on each particular application. In addition, also other signal processing functions, such as upmixing and downmixing of the signal to the desired frequency as in the example of FIG. 2, can be added to the power amplifier 202 and the preamplifier 206 for amplifying the signal.

Upmixing can also be performed in a modulator 204. After the upmixing, the signal is applied to an antenna 200. In the example of FIG. 2, the power amplifier 202 also comprises an amplifier matching circuit. The control signal of the matching circuit is 220. There can be one or more control signals 220. The capacitance of adjustable capacitors of the amplifier matching circuits is adjusted by means of the control signal for adapting the amplifier to the load, i.e. in the transmitter to the antenna(s). The amplifier must be adapted, so that the signal would not distort when amplified, because if the signal distorts there is a risk that information contents of the signal changes. The terminal also comprises a modulator 204, which modulates the carrier with a data signal having desired information according to the selected modulation method. The receiver side of the terminal also comprises an amplifier 206 which amplifies the signal coming from the antenna. The amplifier of the receiver is generally called a preamplifier. The preamplifier also comprises a matching circuit or a matching circuit is connected thereto. In the example of the figure, the received signal is also downmixed in the preamplifier 206 to a selected intermediate frequency or directly to baseband. In the receiver, the signal can also be downmixed in a demodulator 208. The demodulator 208 demodulates the received signal, so that the data signal can be distinguished from the carrier.

The subscriber terminal also comprises a control block 216, which controls the operation of different terminal parts and carries out necessary measures to process the data generated by the user's speech or the user, such as DSP (Digital Signal Processing), D/A conversion and filtration. The control block 216 can also control a separate D/A converter 309 or directly electrodes 302, 303A, 303B. The control block also performs both encoding and decoding, such as channel and speech encoding. In addition, if a spread spectrum system, such as UMTS (Universal Mobile Telecommunication System) is used, the control block 216 also controls spreading of the signal spectrum onto a broad band for transmission by means of a pseudo-random spreading code and despreading of the received signal with the intention of increasing the capacity of the channel. The actual spectrum spreading typically takes place after modulation and despreading prior to demodulation. The control block 216 also adapts the transmitted signal and the signalling information according to the air interface standard of the radio system in use. The control block 216 controls the operation of adjustable amplifiers, so that the signal transmission power is suitable on the radio path and so that the level of the received signal is sufficient for a detector. The control unit's 216 measurements on the signal transmitted by the radio system network part, such as bit error ratio measurements, delay estimation and power measurements, are utilized for adjusting the signal power to a suitable level. Software controlling the operation of the terminal is executed in the control block 216.

In addition, the terminal comprises a memory 218 which comprises software controlling the operation of the terminal, for instance.

The above-described terminal functions can be implemented in a variety of ways, for instance, with software executed by a processor, or with equipment implementation, such as a logic constructed of separate components, or an ASIC (Application Specific Integrated Circuit).

The terminal user interface comprises a loudspeaker or an earpiece 210, a microphone 212, a display 214 and possibly a keypad, which communicate with the control block 216.

Figure 3A:
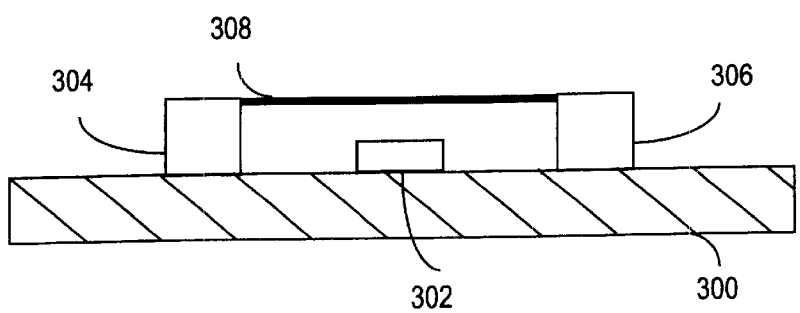
Figure 3B:
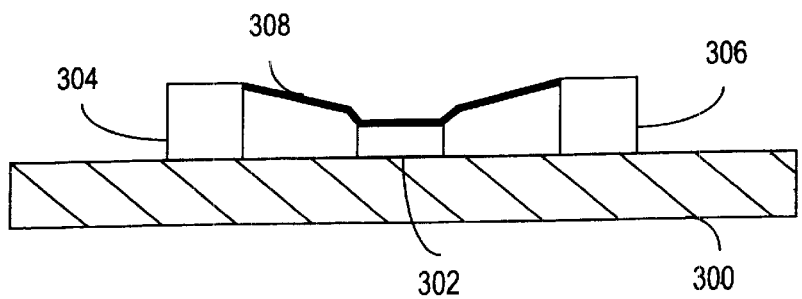

The prior art MEMS technology enables quick manufacturing of capacitors that are adjustable in large value range and that also have a good G value, i.e. quality factor. FIGS. 3a–c show an example of the structure and operation of a microelectromechanical (MEMS) capacitors by means of simplified schematic views. It should be noted that the components may include also other structural parts, such as a plurality of control electrodes or contact surfaces for providing RF connections. FIGS. 3a–b show a simplified, switch-type on/off MEMS capacitor. The MEMS capacitor has an electrode 302 prepared onto a semi-conductor disc 300, and the surface of the electrode is of isolating material. The most commonly used semi-conductor materials are silicon (Si) or gallium-arsenide (GaAs). On top of the electrode there is generally a membrane-like structure 308 made of a conductive material, typically metal, such as aluminium. This membrane 308 forms a bridge-like structure, which is connected either at both ends or only at one end to a thicker metal layer 304, 306, which is ground potential. An air gap between the electrode 302 and the membrane bridge 308 determines the MEMS capacitor's blocking-state capacitance, i.e. off-capacitance. If voltage potential is not switched to the component, the tensile stress of the membrane bridge 308 keeps it up, off the electrode 302. When DC voltage is switched to the electrode 302 below the bridge 308, positive and negative charges are formed in the electrode 302 and on the surface of the membrane bridge 308. When the electric tension is sufficient, the membrane bridge 308 touches the electrode 302. Thus, the isolation material of the electrode 302 surface determines the MEMS capacitor's pass-state capacitance, i.e. on-capacitance. Because there is isolation material on the surface of the electrode, the bridge touches this isolation material, not the electrode itself, so the bridge has no galvanic contact to the electrode. FIG. 3c shows a simplified structural view of the operation of a MEMS capacitor, in which the capacitance value can be adjusted in a given value range. In this case, it is possible to provide various intermediate capacitance values between the extreme states of FIGS. 3a–b by controlling the magnitude of DC voltage applied to the electrode 302 and thus the distance between the membrane 308 and the electrode. Auxiliary electrodes 303A, 303B, which operate substantially in the same manner as the electrode, can be arranged to assist the electrode 302. Each auxiliary electrode 303A, 303B is advantageously connected directly to the output signal of the control block 216, or alternatively to a D/A converter 309 controlled by the control block 216. The publication *International Journal of RF and Microwave Computer-Aided Engineering*, John Wiley & Sons, Inc., CAE 9:362–374, 1999, gives further information on MEMS capacitors. The publication is incorporated herein as reference.

Figure 4A:
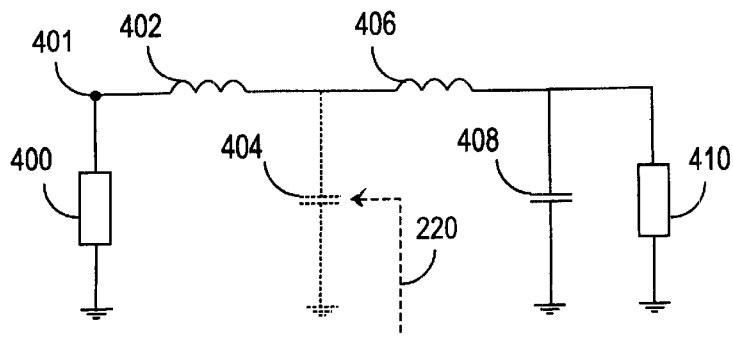
FIGS. 4a–b illustrate an example of an on/off-type MEMS capacitor used in a matching circuit.
Figure 4B:
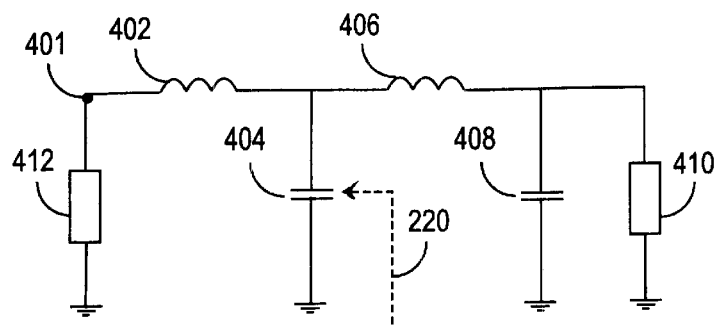

FIGS. 4a–b show a simple example of an adjustable MEMS capacitor used for adapting a radio-frequency amplifier to load impedance. In the solution presented, the amplifier can be adapted to two different impedance relations $Z_{pa1}/Z_{load}$ and $Z_{pa2}/Z_{load}$, which are relative to two different output power levels. $Z_{pa1}$, 412 is the amplifier's optimum load impedance at a node 401, when output power is high, for instance, when $Z_{pa1}$ is 1 Ω. Correspondingly, $Z_{pa2}$, 400 is the amplifier's optimum load impedance at the node 401, when output power is low. Low output power is e.g. 10 dB lower than high output power, whereby the optimum load impedance can be e.g. tenfold, in this example 10 Ω, if the amplifier's DC supply voltage is constant, as typically in subscriber terminals of a cellular radio system. $Z_{load}$ is load impedance 410, which in this example is 50 Ω. If the values of coils 402 and 406 and capacitors 404 and 408 are selected suitably, and if the capacitor 404 is an on/off MEMS capacitor, as in FIGS. 4a–b, the impedance adaptions can be implemented by selecting the state of the capacitor 404 correspondingly. The MEMS capacitor's on-state has high capacitance and off-state has low capacitance. High capacitance is needed for the adaption from impedance $Z_{pa1}$ 412 to impedance $Z_{load}$ 410, whereby the impedance relation is high. Low capacitance is needed for the adaption from impedance $Z_{pa2}$ 400 to impedance $Z_{load}$ 410. It should be noted that in the above example the capacitor 408 can also be a MEMS capacitor and 404 an ordinary capacitor or both capacitors 404 and 408 can be MEMS capacitors. There can be one or more control signals 220. The number of capacitors, also MEMS capacitors, as well as the matching circuit topology may vary depending on the application. In the design of the amplifier or the relating circuits, other components, such as resistances and transistors, can also be used, when necessary.

Figure 5:
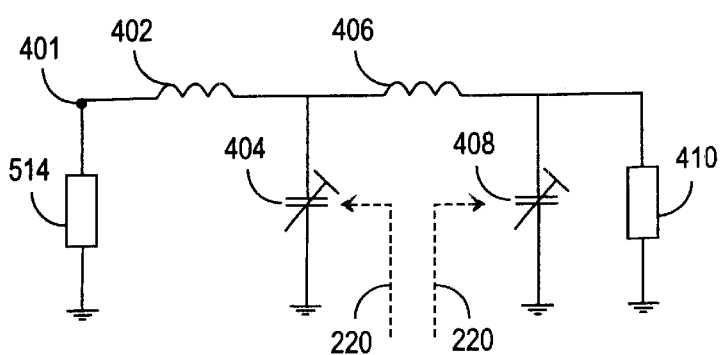
FIG. 5 illustrates an example of a tunable MEMS capacitor used in a matching circuit.

FIG. 5 shows a more complex example of an adjustable MEMS capacitor used in an amplifier. In the example of the figure, both capacitors 404 and 408 are MEMS capacitors and adjustable within a given value range. $Z_{pa}$, 514 is the amplifier's optimum load impedance at a node 401. $Z_{pa}$, 514 is the amplifier's optimum load at node 401. By means of two MEMS capacitors with wide adjustment range it is possible to adapt several impedance values and also reactive impedances. It is also possible to combine MEMS capacitors of on/off-type and having wide adjustment range in the same application. The number of components as well as the matching circuit topology may also vary depending on the application. In the design of the amplifier or the relating circuits, other components, such as resistances and transistors, can also be used, when necessary. A two-state on/off capacitor provides a larger difference between extreme values, i.e. a difference in capacitance between on and off states, than a capacitor that is adjustable to several different states. Which capacitor type is selected depends on the application: is a large difference in capacitance needed or a plurality of different capacitance values. It is also possible to combine different types in the same amplifier or the relating circuit.

Even though the adaption of the radio frequency amplifier may randomly change, the frequency of the channel used remains fixed, however. The controller 216 is aware of this frequency and by means of the auxiliary electrode 303A the D/A converter 309 controls the basic capacitance of the MEMS capacitor to be suitable. FIG. 3C also shows a second advantageous, simple implementation, in which the controller 216 controls the basic capacitance of the MEMS capacitor, for a necessary quantity, by means of control bits and auxiliary electrodes 303A, 303B. By means of the electrode 302, the radio frequency amplifier is further adapted to other variables, such as the transmission power used. By changing the basic capacitance of at least one MEMS capacitor, it is possible to arrange an optimal adaption in a simple manner irrespective of the channel used. This additional control is particularly advantageous in connection with broadband radio-frequency amplifiers, in which the channel used can be selected from a broad frequency band.

Figure 6:
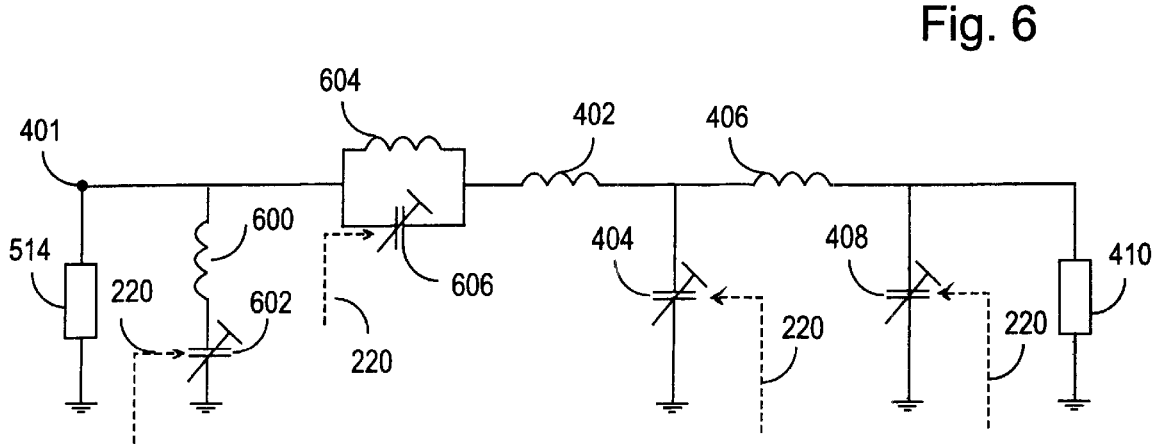
FIG. 6 illustrates an example of an LC circuit in connection with a matching circuit.

FIG. 6 shows an example of an amplifier and an LC circuit attached thereto which tunes harmonic signals, i.e. an electric circuit switching consisting of at least one coil and at least one capacitor. There can be one or more LC circuits. The amplifier typically generates harmonic frequencies depending on the components used. The harmonic frequencies, in particular the second harmonic frequency, are generally undesired, because they cause power losses, for instance. To improve the amplifier's efficiency, the harmonic signals, or any one of them, are tuned. A typical solution is a frequency-selective circuit which is tuned to the frequency of the second harmonic signal. According to prior art, it can be implemented by a simple LC circuit which resonates at the frequency of the second harmonic signal, and thus short-circuits that portion of the signal which includes the second harmonic frequency. In general, the LC circuit consists of one coil and one capacitor that are coupled either in series, as in the figure, or in parallel. A problem with the prior art solution is that the circuit operates efficiently only in a narrow frequency range. When a MEMS capacitor is used in the LC circuit, adjustability makes it possible to achieve a broad frequency range around the harmonic frequency range by tuning the circuit electrically. In FIG. 6, the coil of the first LC circuit is 600, and the adjustable MEMS capacitor is 602 and the coil of the second LC circuit is 604 and the adjustable MEMS capacitor is 606, and the control signal 220 controlling them can be the same or different. In this application, the use of a capacitor with a large value range is more advantageous as compared with an on/off-type capacitor, because the circuit can be adjusted to resonate more accurately at different harmonic frequencies. If the MEMS capacitor has a sufficiently large adjustment range, the LC circuit can also be adjusted to resonate at the frequency of the third harmonic signal.

FIG. 7 shows a flow chart of the method steps of adapting the amplifier to load impedance with a matching circuit as output power varies. The matching circuit comprises one or more MEMS capacitors and an interface for receiving a control signal controlling the capacitance of the MEMS capacitors. The method starts from block 700. In block 701, the basic capacitance of the MEMS capacitor is adjusted suitable for a channel used. Next, in block 702, the capacitance of microelectromechanical (MEMS) capacitors of the matching circuit are adjusted such that the amplifier operates optimally at each particular output power level. Adjustment is repeatable in nature, i.e. according to arrow 703, the operation of block 702 is repeated. When the capacitance of the MEMS capacitor is adjusted as the output power changes, the amplifier is made to operate optimally in a large power range. The adjustable MEMS capacitors can be on/off-type capacitors or adjustable within a given value range. The matching circuit can only use MEMS capacitors of either type or various combination solutions which employ both component types. Arrow 704 depicts the repetition of the method every time the output power changes. The performance of the method stops in block 706.

FIG. 8 shows a flow chart of the method steps of tuning the harmonic signal frequencies. Performance of the method starts from block 800. Next, in block 802, the harmonic signals are tuned with an LC circuit, which comprises one or more MEMS capacitors. In block 804, a control signal controlling the capacitances of the MEMS capacitors is received through an interface in the LC circuit. Finally, in block 806, the capacitance of the MEMS capacitor is adjusted such that the LC circuit resonates at the frequency of the harmonic signal concerned. Performance of the method ends in block 808. Arrow 810 depicts the repetition of the method as the frequency of the harmonic signal changes.

Even though the invention is described in the above with reference to the example of the attached drawings, it is clear that the invention is not restricted thereto, but it can be modified in a variety of ways within the scope of the inventive idea disclosed in the attached claims.

What is claimed is:

1. A matching circuit for adapting a radio-frequency amplifier to load impedance at various output power levels of the radio-frequency amplifier, the matching circuit being common for all power levels and the matching circuit comprising an interface for receiving power level control signals which determine capacitance of one or more capacitors, and at least one matching circuit capacitor is a microelectromechanical (MEMS) capacitor whose capacitance the power level control signals adjust for the radio-frequency amplifier to operate optimally at a selected frequency at any particular power level and thus making the radio-frequency amplifier operate optimally in the whole desired power range.

2. The matching circuit as claimed in claim 1, wherein one or more LC circuits, i.e. an electric circuit switching including at least one coil and at least one capacitor is connected to the matching circuit for tuning harmonic signals resulting from amplifier non-linearities, comprising at least one adjustable microelectromechanical (MEMS) capacitor whose capacitance the control signals control such that the LC circuit resonates at the frequency of the harmonic signal to be tuned.

3. The matching circuit as claimed in claim 1, wherein basic capacitance of the microelectromechanical (MEMS) capacitor is adjusted suitable for the channel used and wherein the MEMS capacitors are adjustable to a plurality of different values within a predetermined value range.

4. The matching circuit as claimed in claim 1, wherein basic capacitance of the microelectromechanical (MEMS) capacitor is adjusted suitable for a channel used.

5. The matching circuit as claimed in claim 1, wherein the MEMS capacitors are on/off adjustable.

6. The matching circuit as claimed in claim 1, wherein the MEMS capacitors are adjustable to a plurality of different values within a predetermined value range.

7. The matching circuit as claimed in claim 1, wherein one or more LC circuits, i.e. an electric circuit switching including at least one coil and at least one capacitor is connected to the matching circuit for tuning harmonic signals resulting from amplifier non-linearities, comprising at least one adjustable microelectromechanical (MEMS) capacitor whose capacitance the control signals control such that the LC circuit resonates at the frequency of the harmonic signal to be tuned and wherein basic capacitance of the microelectromechanical (MEMS) capacitor is adjusted suitable for the channel used.

8. The matching circuit as claimed in claim 1, wherein one or more LC circuits, i.e. an electric circuit switching including at least one coil and at least one capacitor is connected to the matching circuit for tuning harmonic signals resulting from amplifier non-linearities, comprising at least one adjustable microelectromechanical (MEMS) capacitor whose capacitance the control signals control such that the LC circuit resonates at the frequency of the harmonic signal to be tuned and wherein the MEMS capacitors are on/off adjustable.

9. The matching circuit as claimed in claim 1, wherein one or more LC circuits, i.e. an electric circuit switching including at least one coil and at least one capacitor is connected to the matching circuit for tuning harmonic signals resulting from amplifier non-linearities, comprising at least one adjustable microelectromechanical (MEMS) capacitor whose capacitance the control signals control such that the LC circuit resonates at the frequency of the harmonic signal to be tuned and wherein the MEMS capacitors are adjustable to a plurality of different values within a predetermined value range.

10. The matching circuit as claimed in claim 1, wherein basic capacitance of the microelectromechanical (MEMS) capacitor is adjusted suitable for the channel used and wherein the MEMS capacitors are on/off adjustable.

11. A method for adapting a radio-frequency amplifier to load impedance with a matching circuit at various output power levels of the radio-frequency amplifier, the matching circuit being common for all power levels and the matching circuit comprising one or more LC circuits, i.e. an electric circuit switching including at least one coil and at least one capacitor for tuning harmonic signals resulting from amplifier non-linearities, comprising tuning harmonic signals by an LC circuit which comprises at least one adjustable microelectromechanical (MEMS) capacitor, receiving power level control signals adjusting capacitance of the microelectromechanical (MEMS) capacitor through an interface in the LC circuit, adjusting the capacitance of the microelectromechanical (MEMS) capacitor by at least one power level control signal such that the LC circuit resonates at the frequency of the harmonic signal to be tuned.

12. A method for adapting a radio-frequency amplifier to load impedance with a matching circuit at various output power levels of the radio-frequency amplifier, the matching circuit being common for all power levels and the matching circuit comprising an interface for receiving power level control signals which determine capacitance of one or more capacitors, comprising adjusting the capacitance of at least one microelectromechanical (MEMS) capacitor of the matching circuit such that the radio-frequency amplifier operates optimally in a broad output power level range.

13. The method as claimed in claim 12, wherein harmonic signals resulting from amplifier non-linearities are tuned by one or more LC circuits connected to the matching circuit, i.e. with an electric circuit switching including at least one coil and at least one capacitor, the LC circuit comprising at least one adjustable microelectromechanical (MEMS) capacitor whose capacitance the control signals adjust such that the LC circuit resonates at the frequency of the harmonic signal to be tuned.

14. The method as claimed in claim 12, comprising adjusting basic capacitance of the microelectromechanical (MEMS) capacitor suitable for the channel used and wherein the MEMS capacitors are adjustable to a plurality of different values within a predetermined value range.

15. The method as claimed in claim 12, comprising adjusting basic capacitance of the microelectromechanical (MEMS) capacitor suitable for a channel used.

16. The method as claimed in claim 12, wherein the MEMS capacitors are on/off adjustable.

17. The method as claimed in claim 12, wherein the MEMS capacitors are adjustable to a plurality of different values within a predetermined value range.

18. The method as claimed in claim 12, wherein harmonic signals resulting from amplifier non-linearities are tuned by one or more LC circuits connected to the matching circuit, i.e. with an electric circuit switching including at least one coil and at least one capacitor, the LC circuit comprising at least one adjustable microelectromechanical (MEMS) capacitor whose capacitance the control signals adjust such that the LC circuit resonates at the frequency of the harmonic signal to be tuned and adjusting basic capacitance of the microelectromechanical (MEMS) capacitor suitable for the channel used.

19. The method as claimed in claim 12, wherein harmonic signals resulting from amplifier non-linearities are tuned by one or more LC circuits connected to the matching circuit, i.e. with an electric circuit switching including at least one coil and at least one capacitor, the LC circuit comprising at least one adjustable microelectromechanical (MEMS) capacitor whose capacitance the control signals adjust such that the LC circuit resonates at the frequency of the harmonic signal to be tuned and wherein the MEMS capacitors are on/off adjustable.

20. The method as claimed in claim 12, wherein harmonic signals resulting from amplifier non-linearities are tuned by one or more LC circuits connected to the matching circuit, i.e. with an electric circuit switching including at least one coil and at least one capacitor, the LC circuit comprising at least one adjustable microelectromechanical (MEMS) capacitor whose capacitance the control signals adjust such that the LC circuit resonates at the frequency of the harmonic signal to be tuned and wherein the MEMS capacitors are adjustable to a plurality of different values within a predetermined value range.

21. The method as claimed in claim 12, comprising adjusting basic capacitance of the microelectromechanical (MEMS) capacitor suitable for the channel used and wherein the MEMS capacitors are on/off adjustable.

22. A matching circuit for adapting a radio-frequency amplifier to load impedance at various output power levels of the radio-frequency amplifier, the matching circuit being common for all power levels and the matching circuit comprising one or more LC circuits, i.e. an electric circuit switching including at least one coil and at least one capacitor for tuning harmonic signals resulting from amplifier non-linearities, wherein at least one capacitor of the LC circuit is an adjustable microelectromechanical (MEMS) capacitor, the LC circuit comprises an interface for receiving power level control signals adjusting the capacitance of the microelectromechanical (MEMS) capacitor, the power level control signal adjusts the capacitance of the microelectromechanical (MEMS) capacitor such that the LC circuit resonates at the frequency of the harmonic signal to be tuned.

* * * * *